(12) United States Patent
Pierce et al.

(10) Patent No.: US 9,411,385 B2
(45) Date of Patent: Aug. 9, 2016

(54) ELECTRONIC DEVICE ASSEMBLY WITH COMPRESSION GASKET

(71) Applicant: GOOGLE TECHNOLOGY HOLDINGS LLC., Mountain View, CA (US)

(72) Inventors: Amber M. Pierce, Libertyville, IL (US); Morris B. Bowers, Grayslake, IL (US); Adam R. Cole, Gurnee, IL (US); Srikanth V. Thiruppukuzhi, Vernon Hills, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 400 days.

(21) Appl. No.: 13/892,571

(22) Filed: May 13, 2013

(65) Prior Publication Data
US 2014/0334081 A1 Nov. 13, 2014

(51) Int. Cl.
 H05K 7/20 (2006.01)
 G06F 1/20 (2006.01)
 G06F 1/16 (2006.01)
 H05K 9/00 (2006.01)

(52) U.S. Cl.
 CPC .............. *G06F 1/203* (2013.01); *G06F 1/1658* (2013.01); *H05K 9/0026* (2013.01)

(58) Field of Classification Search
 CPC ...... G06F 1/203; G06F 1/1658; H05K 9/0026
 USPC ......................................... 361/704–723, 818
 See application file for complete search history.

(56) References Cited

U.S. PATENT DOCUMENTS

| 6,744,640 | B2 * | 6/2004 | Reis ...................... H01L 23/552 174/383 |
| 6,982,874 | B2 | 1/2006 | Smalc et al. |
| 7,161,809 | B2 | 1/2007 | Ford et al. |
| 7,292,441 | B2 | 11/2007 | Smalc et al. |
| 2002/0064024 | A1 | 5/2002 | McCullough et al. |
| 2009/0091888 | A1 | 4/2009 | Lin et al. |
| 2012/0044635 | A1 | 2/2012 | Rothkopf et al. |

FOREIGN PATENT DOCUMENTS

| EP | 1533840 B1 | 5/2005 |
| EP | 1691593 A1 | 8/2006 |
| WO | 2014186125 A1 | 11/2014 |

OTHER PUBLICATIONS

International Search Report and Written Opinion received for PCT Patent Application No. PCT/US2014/035995, mailed on Jul. 25, 2014, 11 pages.

* cited by examiner

*Primary Examiner* — Ramon M Barrera

(57) ABSTRACT

An assembly (1000) includes a substrate (1002) and a heat emissive electrical component (1001) disposed on the substrate. A shield (1003) is disposed on the substrate, thereby enclosing the heat emissive electrical component. A display assembly (101) is disposed above the shield. A compressible pad (1004) is disposed between the shield and the display assembly. The compressible pad defines an aperture (1005) above the heat emissive electrical component. The aperture can have dimensions that are a function of a shield area and a heat emissive electrical component area.

19 Claims, 12 Drawing Sheets

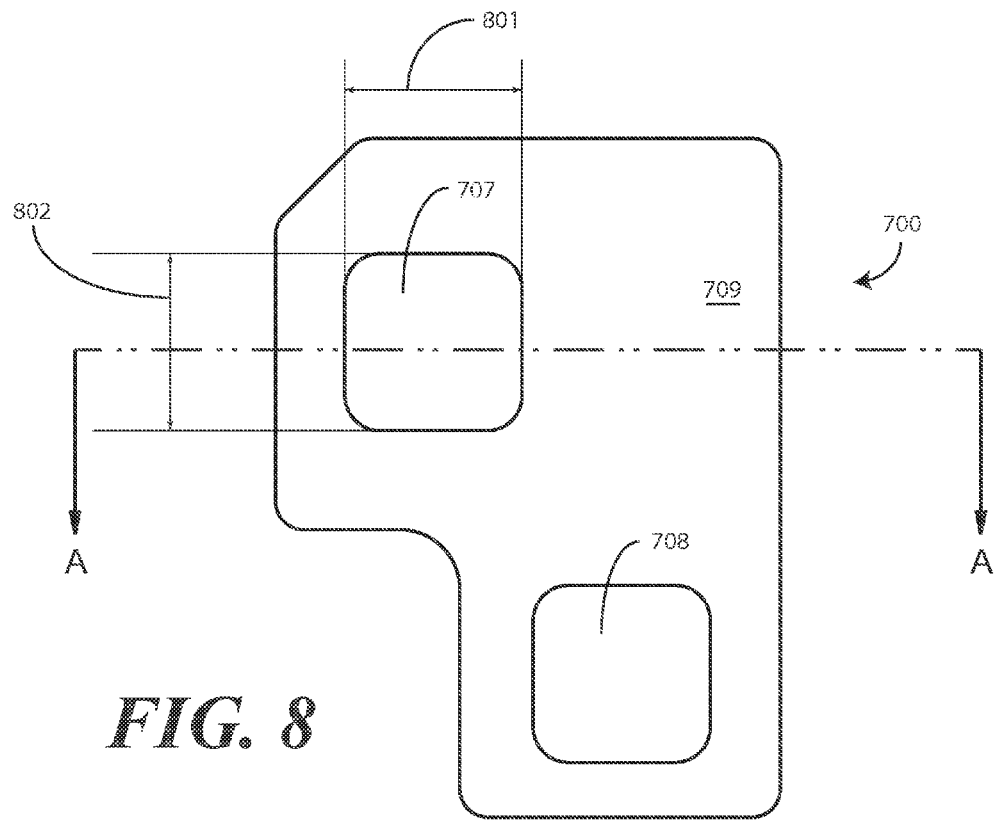
FIG. 8
FIG. 13  SECTION A-A

ELECTRONIC DEVICE ASSEMBLY WITH COMPRESSION GASKET

BACKGROUND

1. Technical Field

This disclosure relates generally to electronic devices, and more particularly to electronic devices employing compression devices.

2. Background Art

"Intelligent" portable electronic devices, such as smart phones, tablet computers, and the like, are becoming increasingly powerful computational tools. Moreover, these devices are becoming more prevalent in today's society. For example, not too long ago a mobile telephone was a simplistic device with a twelve-key keypad that only made telephone calls. Today, "smart" phones, tablet computers, personal digital assistants, and other portable electronic devices not only make telephone calls, but also manage address books, maintain calendars, play music and videos, display pictures, and surf the web.

As the capabilities of these electronic devices have progressed, so too have their user interfaces. Prior keypads having a limited number of keys have given way to sophisticated user input devices such as touch sensitive screens or touch sensitive pads. Touch sensitive displays include sensors for detecting the presence of an object such as a finger or stylus. By placing the object on the touch sensitive surface, the user can manipulate and control the electronic device without the need for a physical keypad.

Touch sensitive electronic devices have drawbacks in that the sophisticated displays can be prone to damage. Mechanical and thermal shock can damage a display, potentially rendering it inoperable. It would be advantageous to have an electronic device with a display that is more resistant to such stresses.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

FIGS. 8 and 13 illustrate a plan and sectional view of an explanatory compression device configured in accordance with one or more embodiments of the disclosure.

Figure 1:
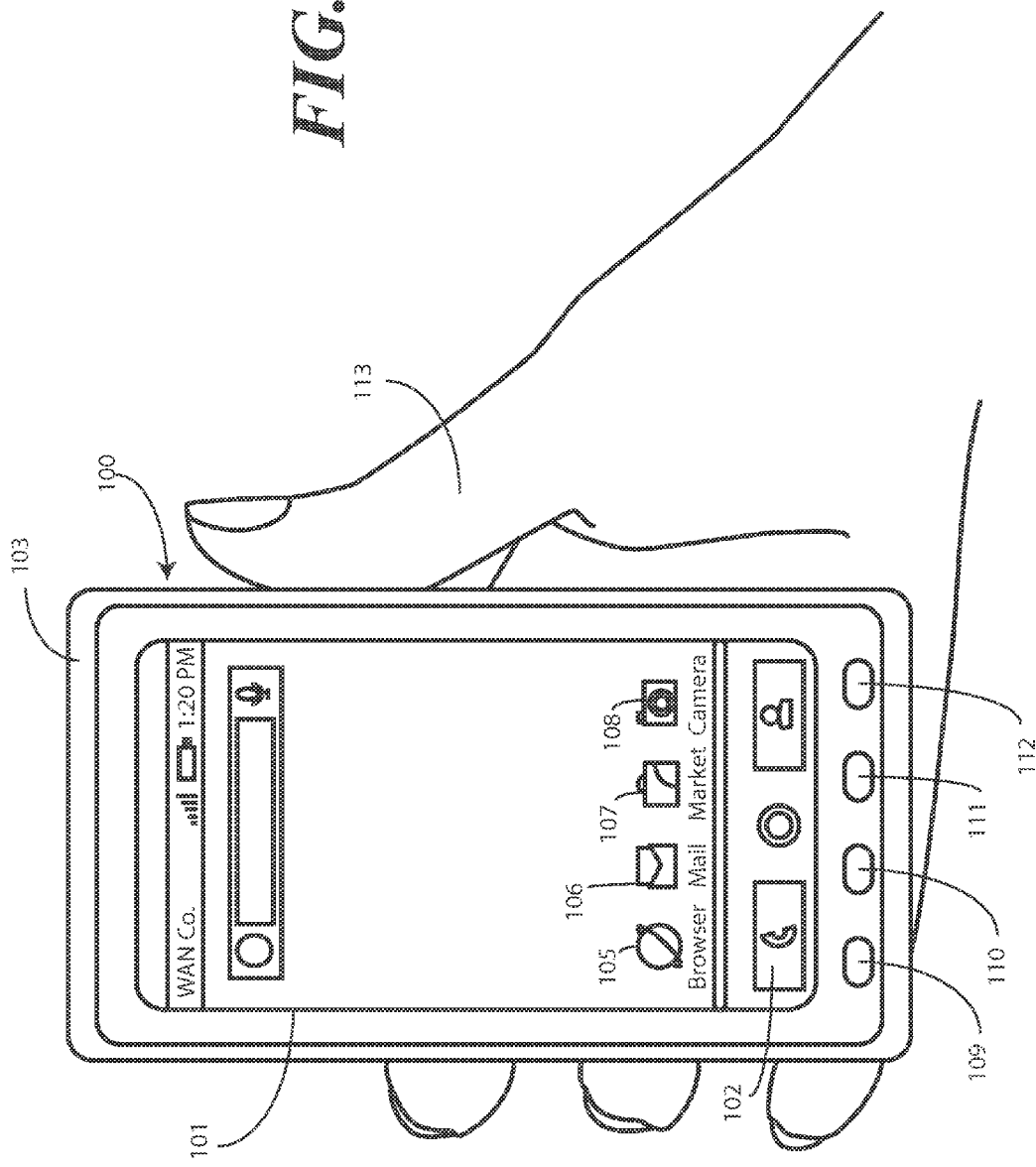
FIGS. 1 and 2 illustrate an explanatory electronic device configured in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Consumers of electronic devices frequently prefer thinner, sleeker form factors. At the same time, these consumers generally want higher power processors for increased overall performance. It is axiomatic that a more powerful microprocessor, for example, generally dissipates more thermal energy than does a processor having the same form factor and operating at a slower speed. Accordingly, providing a higher power processor in a thinner device is problematic in that the device can become hot. Moreover, too much thermal dissipation into a display assembly, such as an organic light emitting diode display assembly for example, can compromise its reliability.

Embodiments of the present disclosure provide a solution to this problem by providing an assembly having superior thermal performance without the need for making the device thicker or sacrificing processing power. Additionally, embodiments of the present disclosure provide increased structural stability to the overall electronic device, thereby allowing the device to withstand higher mechanical stresses without component damage.

In one embodiment, to make the overall device thinner along the z-axis (where the x and y axes define the major faces of the device), a compressible pad is disposed between a shield attached to a circuit substrate so as to cover a heat emissive electrical component disposed on the substrate and a display assembly. Examples of heat emissive electrical components include microprocessors, control circuits, digital logic circuits, application specific integrated circuits, and so forth. Illustrating by example, in one embodiment, an assembly includes a substrate, a heat emissive electrical component disposed on the substrate, and a shield disposed on the substrate enclosing the heat emissive electrical component. A compressible pad is then disposed between a display assembly and the shield.

So as to avoid thermal transfer from the heat emissive electrical component through the shield and compressible pad to the display assembly, in one embodiment the compressible pad defines an aperture above the heat emissive electrical component. In one embodiment the aperture has dimensions that are a function of a shield area, a heat emissive electrical component area, or combinations thereof. The inclusion of the aperture improves thermal performance by removing a thermal conduit between the heat emissive electrical element and the display.

In prior art systems, solid compressible devices may be positioned between hot components and the display. This is less than ideal from a thermal perspective, as the compressible device can be in significant compression and does not effectively deter thermal transfer between the hot components and the display. Experimental testing has shown that heat transfer is increased with compression of the compression device. Said differently, the greater the device is compressed, the better it acts as a conductor of heat straight from the hot component to the display.

Embodiments of the disclosure avoid this malady by providing a chamber disposed between the display and shields disposed over hot components. In some embodiments, a heat spreader can then be disposed atop the shield or deposited on a major face of the compressible pad to further help draw heat away in the x and y dimensions. Experimental testing has shown that air is a relatively poor thermal conductor and transfers less heat than a prior art, compressed, compression device.

Embodiments of the disclosure do not place arbitrary apertures in compressible pads, however, as doing so can exacerbate the susceptibility to mechanical stress noted above. If random apertures are placed in a compressible pad, their inclusion can poses problems for display mechanical strains and substrate mechanical strains.

To solve this issue, in one embodiment the aperture has dimensions that are related to shield area, heat emissive electrical component area, or combinations thereof. In effect, by correlating the size of the aperture to both the size of the shield and the size of the thermal components disposed beneath the shield, the apertures are strategically aligned over heat generating components to not only improve resistance of the display to mechanical stress, but to improve the structural stability of the overall device compared to prior art designs using solid compression devices.

In one embodiment, the aperture is designed to be as large as possible while still allowing the compressible pad to support the shield perimeter. Such an embodiment provides a small insulating window or chamber within the shield perimeter that is disposed directly between the display and the heat emissive electrical component. Accordingly, such an embodiment maximizes the amount of air directly over the heat emissive electrical component without compromising mechanical stress resistance, thereby reducing heat transfer to the display while still maintaining good support of the shield. Embodiments of the disclosure effectively control substrate strains about the shield. The display assembly retains sufficient compression area of the compressible pad along its rear face to resist mechanical stress.

Embodiments of the disclosure provide a preferred construction for electronic devices having display devices arranged directly above shields with a compressible pad disposed therebetween. Embodiments of the disclosure provide universal compressible pad coverage behind the display, other than within the perimeter of the aperture or apertures, to provide desirable strain support for the display. Embodiments of the disclosure provide universal compressible pad support of the substrate components and shield assembly, as the aperture is strategically shaped to still allow for perimeter support of the shield, effectively controlling for strains in this area. Embodiments of the disclosure provide optimized thermal performance, even more so when heat-spreading material is added to the compressible pad with an air chamber disposed directly over heat emissive electrical components.

Turning now to FIG. 1, illustrated therein is one embodiment of an electronic device 100 configured in accordance with one or more embodiments of the disclosure. The explanatory electronic device 100 of FIG. 1 is shown as a smart phone for illustrative purposes. However, it will be obvious to those of ordinary skill in the art having the benefit of this disclosure that other electronic devices may be substituted for the explanatory smart phone of FIG. 1. For example, the electronic device 100 may be configured as a palm-top computer, a tablet computer, a gaming device, wearable computer, a media player, or other device.

A user 113 is holding the electronic device 100. The operating system environment, which is configured as executable code operating on one or more processors or control circuits of the electronic device 100, has associated therewith various applications or "apps." Examples of such applications shown in FIG. 1 include a cellular telephone application 102 for making voice telephone calls, a web browsing application 105 configured to allow the user 113 to view webpages on the display assembly 101 of the electronic device 100, an electronic mail application 106 configured to send and receive electronic mail, a shopping application 107 configured to permit a user to shop for goods and services online, and a camera application 108 configured to capture still (and optionally video) images. These applications are illustrative only, as others will be obvious to one of ordinary skill in the art having the benefit of this disclosure.

The display assembly 101 of the electronic device 100 is configured as an organic light emitting diode display. An organic light emitting diode display is one type of display assembly 101 suitable for use with the disclosure, and will accordingly be used for explanatory purposes in this disclosure. However, it should be noted that other types of displays, including liquid crystal displays, would be obvious to those of ordinary skill in the art having the benefit of this disclosure.

In one embodiment the display assembly 101 comprises two substrate layers having a liquid crystal or organic polymer disposed therebetween. In the case of an organic light emitting diode layer, a film of organic material will be disposed between the two substrate layers. Each substrate layer is coupled to the other by a seam disposed about a periphery of the display assembly 101. In the case of an organic light emitting diode display, the seam disposed about the periphery is formed by fusing two glass substrates together with a fused weld known as a "frit." A frit is a ceramic composition that is thermally fused between layers of glass to form a seam or seal between those two substrates. Experimental testing has shown the frit forming the seam is very brittle. Moreover, testing has shown that the frit forming the seam fractures easily allowing the glass substrates to separate in a cleavage mode. The organic film sealed between the glass substrates and the frit then leaks out, rendering the display inoperable. The seam serves as a lateral boundary for the liquid crystal, organic polymer, or other material disposed between the substrate layers. The seam both holds the substrate layers together and keeps the liquid crystal, organic polymer, or other material disposed between the substrate layers from escaping.

Embodiments of the disclosure advantageously work to prevent cleavage mode failure of the seam by providing a compressible pad that is disposed between the display and an underlying shield to apply a compression force against the display to preload the display against one of the housing members of the device. Accordingly, the compressible pad serves as a clamping member to prevent fit cleavage failures. This will be explained in more detail below.

Figure 2:
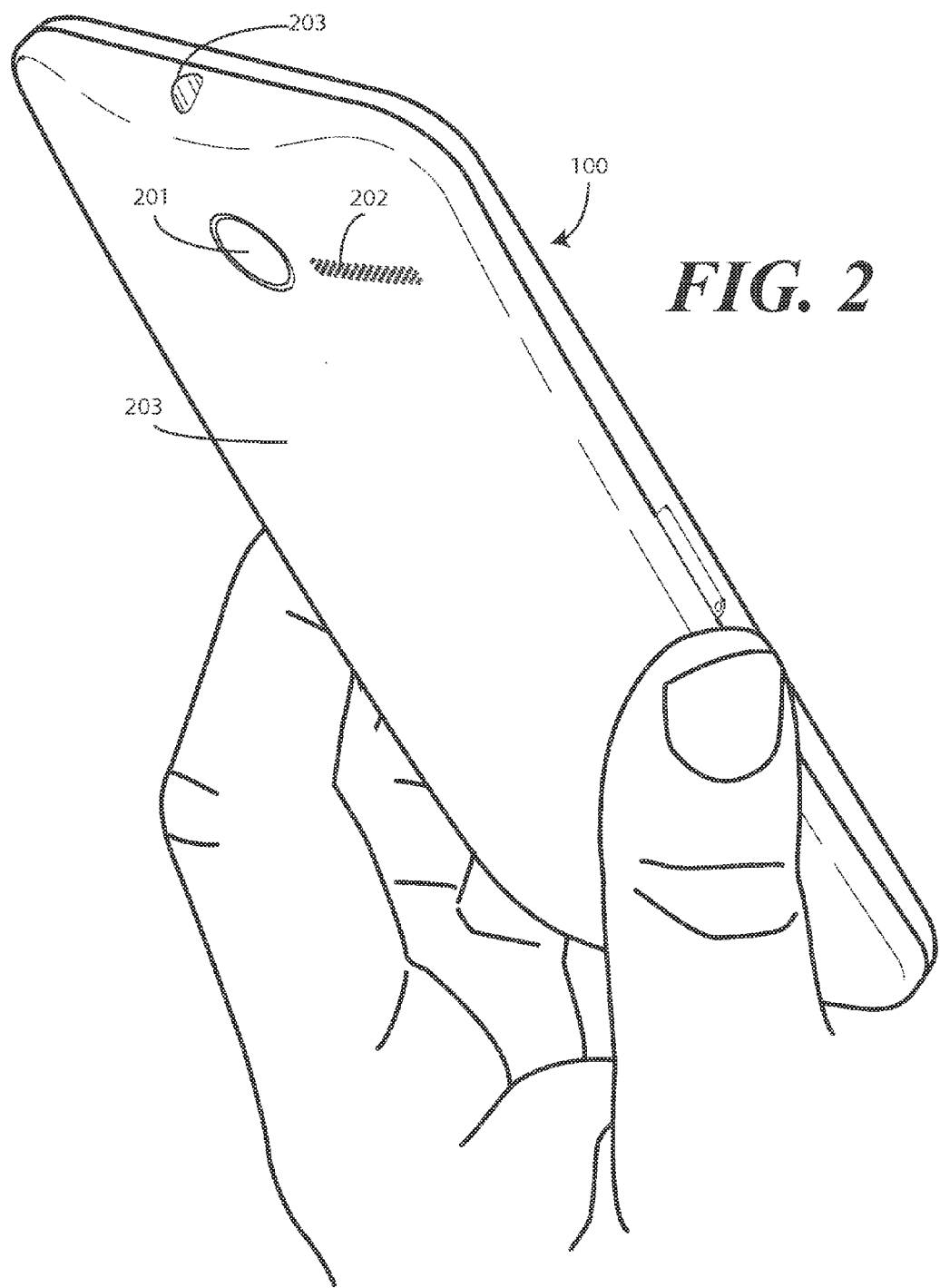

The explanatory electronic device 100 of FIG. 1 includes two housing members. An upper housing member 103 is disposed about the periphery of the display assembly 101. As shown in FIG. 2, a lower housing member 203 forms the backside of the electronic device 100 in this illustrative embodiment. Features can be incorporated into the housing members, including the buttons 109,110,111,112 disposed along the upper housing member 103 shown in FIG. 1, or the camera 201, speaker port 202, or audio jack 204 shown in FIG. 2.

Figure 3:
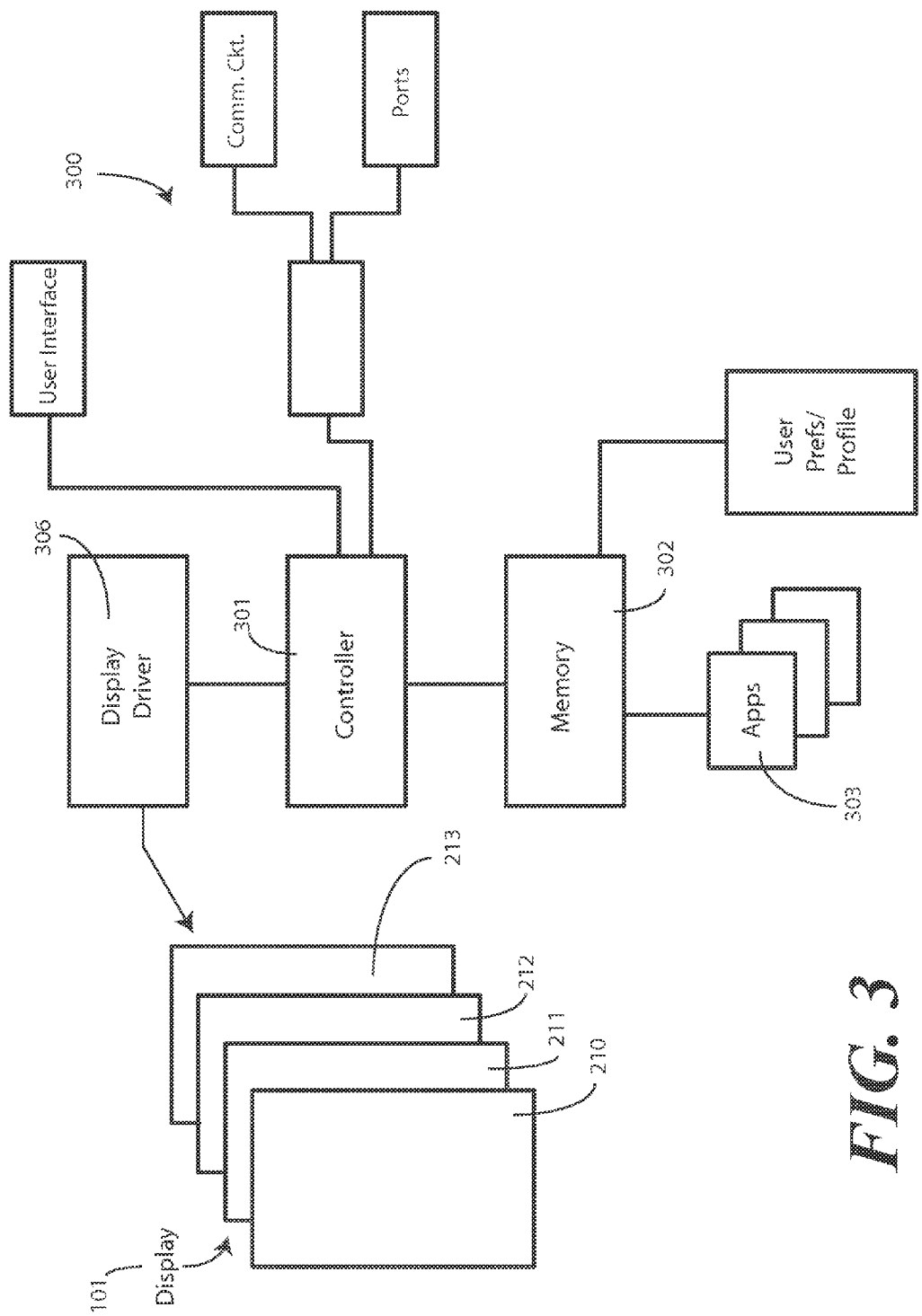
FIG. 3 illustrates a schematic block diagram of an explanatory electronic device configured in accordance with one or more embodiments of the disclosure.

Turning now to FIG. 3, illustrated therein is the electronic device (100) shown as a schematic block diagram 300. The schematic block diagram 300 illustrates one embodiment of internal circuitry, software modules, firmware modules, and other components in that can be included in an explanatory electronic device (100) configured in accordance with embodiments of the disclosure. While this illustrative internal circuitry is directed to a generic electronic device, note that it could be readily adapted to any number of specific devices.

As shown in the schematic block diagram 300, a control circuit 301 is operable with the display assembly 101, which is configured with touch-sensitive capabilities in this illustrative embodiment. The control circuit 301, which may be a microprocessor, programmable logic, application specific integrated circuit device, or other similar device, is capable of executing program instructions. The program instructions may be stored either in the control circuit 301 or in a memory 302 or other computer readable medium operable with the control circuit 301. The memory 302 can also store executable code corresponding to the various applications 303 that are operable on the electronic device (100), such as those described above with reference to FIG. 1.

The control circuit 301 is configured, in one embodiment, to operate the various functions of the electronic device (100). The control circuit 301 can execute software or firmware applications stored in memory 302 to provide device functionality. In one embodiment, the control circuit 301 is configured to be operable with a display driver 306 to effect and control presentation of information on the display assembly 101.

Coupled to, and operable with, the controller is the display assembly 101. The explanatory display assembly 101 of FIG. 1 is shown as a plurality of layers. While this illustrates one embodiment of a touch sensitive display, it will be clear to those of ordinary skill in the art having the benefit of this disclosure that embodiments of the disclosure are not so limited. Numerous other display configurations, be they touch sensitive or not, can be substituted without departing from the spirit and scope of the disclosure.

In the illustrative embodiment of FIG. 3, the four layers of the display assembly 101 are shown, although other optional layers could be included as needed. Starting from the top, a fascia layer 210 is provided. The fascia layer 210 may be manufactured from glass or a thin film sheet. As used herein, a "fascia" is a covering or housing, which may or may not be detachable. Suitable materials for manufacturing the cover layer include clear or translucent plastic film, glass, plastic, or reinforced glass. Reinforced glass can comprise glass strengthened by a process such as a chemical or heat treatment. The fascia layer 210 may also include a ultra-violet barrier. Such a barrier is useful both in improving the visibility of display assembly 101 and in protecting internal components of the electronic device.

Beneath the fascia layer 210 is the capacitive touch sensor layer 211. The capacitive touch sensor layer 211 is included to provide the touch sensing function. The capacitive touch sensor layer 211, which can be constructed by depositing small capacitive plate electrodes on a transparent substrate, is configured to detect the presence of an object, such as a user's finger or stylus, near to or touching the display assembly 101. Circuitry operable with or disposed within the control circuit 301 is configured to detect a change in the capacitance of a particular plate combination on the capacitive touch sensor layer 211. The capacitive touch sensor layer 211 may be used in a general mode, for instance to detect the general proximate position of an object relative to the touch sensitive display. The capacitive touch sensor layer 211 may also be used in a specific mode, where a particular capacitor plate pair may be detected to detect the precise location of an object along length and width of the touch sensitive display. Note that the capacitive touch sensor layer 211 is a particular implementation of an electromagnetic field sensor, and other types of electromagnetic field sensors, such as a magnetic field sensor, can replace the capacitive field sensor.

Note that while the capacitive touch sensor layer 211 and the fascia layer 210 are shown as separate layers in FIG. 3 for illustrative purposes, in many embodiments they will be integrated into a single element to achieve a thinner overall form factor of the electronic device (100). Accordingly, in one embodiment the capacitive touch sensor layer 211 is integrated with the fascia layer 210 by depositing the capacitor plate electrodes of the capacitive touch sensor layer 211 directly upon the fascia layer 210. For example, indium tin oxide defining the capacitor plate electrodes can be laminated directly to the underside of the fascia layer 210.

Disposed beneath the capacitive touch sensor layer 211 is the display layer 212. The display layer 212 houses the active material that controls the presentation operation of the display assembly 101. For example, where the display layer 212 is an organic light emitting diode layer, the display layer 212 will comprise two substrate layers sealed together at a seam disposed along a periphery of each substrate layer. The substrate layers can have clear control electrodes disposed thereon. For example, the electrodes can be manufactured by depositing indium tin oxide along the substrates. One or more organic thin films are disposed between the substrates and within the seam. When electrical current is applied to the electrodes, the organic films emit light to present information on the display assembly 101.

Were the display layer 212 not an organic light emitting diode layer, but rather another technology such as a liquid crystal layer, additional layers may be required. For example, a backlighting layer may need to be disposed beneath a liquid crystal layer because liquid crystal, unlike organic light emitting diode films, do not produce light.

Beneath the active display layer is an optional reflector 213. The reflector 213 can reflect light generated by the display layer 212 (or a backlighting layer were included) back out of the display assembly 101. The reflector 213 can be manufactured from a reflective material such as polyethylene terephthalate in one embodiment.

Figure 4:
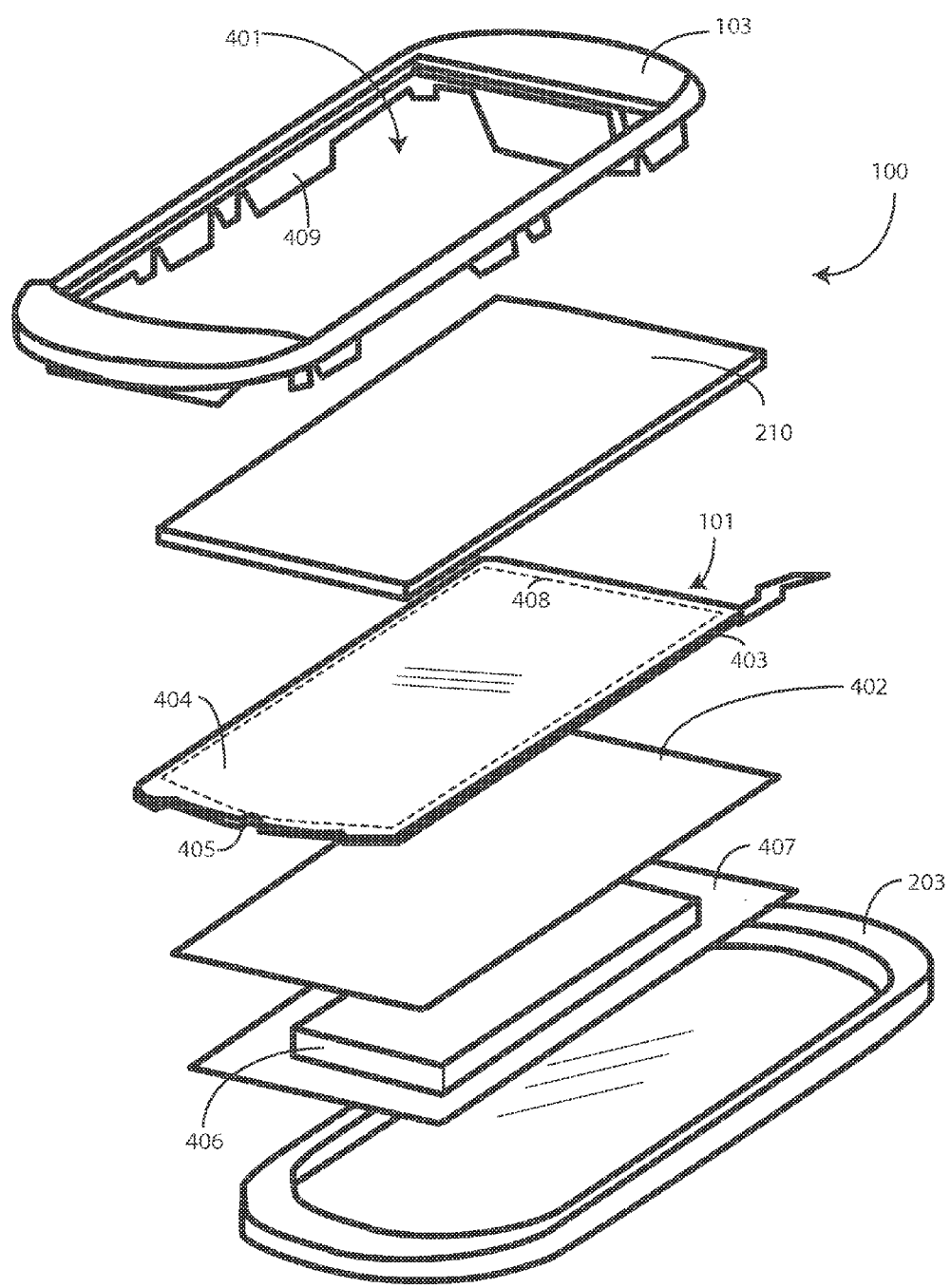
FIG. 4 illustrates an exploded view of an explanatory electronic device configured in accordance with one or more embodiments of the disclosure.

Turning now to FIG. 4, illustrated therein is an exploded view of one explanatory electronic device 100 configured in accordance with one or more embodiments of the disclosure. A first housing member 103 is shown above a fascia layer 210. The first housing member 103 defines an aperture 401. The fascia layer 210 fits within the first housing member 103 to span and cover the aperture 401. Some designers refer to the fascia layer 210 as a "lens," although the fascia layer 210 generally does not include optical magnification properties.

An display assembly 101 is disposed beneath the fascia layer 210. The illustrative display assembly 101 of FIG. 4 includes two substrate layers 404,405 sealed together at a seam 408 disposed along a periphery of each substrate layer 404,405. As used herein, "periphery" refers to an outer region of an area or object, or in this case, an outer region disposed just within a perimeter 403 of the substrate layers 404,405. For example, if the substrate layers 404,405 are three inches by two inches, the periphery may include portions of the substrate layers 404,405 that extend inward from the perimeter 403 two or three tenths of an inch or so.

A compression gasket 402 is then disposed between a shield 406 disposed on a circuit board 407 and the display assembly 101. The compression gasket 402 can comprise one gasket, or multiple gaskets. The compression gasket 402 seats against the second substrate layer 405 of the display assembly 101 to provide a loading force between the display assembly 101 and the shield 406. When a coupler 409, shown here as a mechanical feature on the first housing member 103, couples the first housing member 103 and the second housing member 203 together, the compression gasket 402 becomes preloaded against the display assembly 101. This preloading, in turn, preloads the display assembly 101 against the first housing member 103, thereby helping to prevent cleavage failures at the seam 408.

Figure 5:
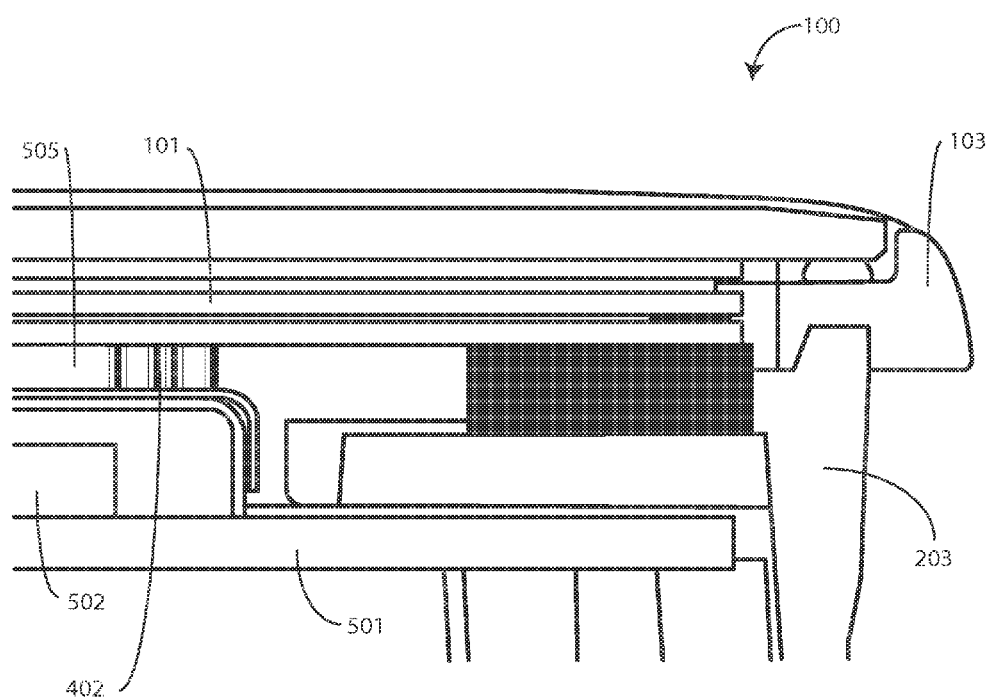
FIG. 5 illustrates a sectional view of a mechanical stack-up for one illustrative electronic device configured in accordance with one or more embodiments of the disclosure.

Turning now to FIG. 5, illustrated therein is a sectional view of the electronic device 100. An assembly of the electronic device 100 includes a substrate 501. In one embodiment, the substrate 501 is a printed circuit board. Other examples of substrates will be obvious to those of ordinary skill in the art having the benefit of this disclosure.

In one embodiment, a heat emissive electrical component 502 is disposed on the substrate 501. The heat emissive electrical component 502 can be any of a number of electronic devices that dissipate electrical energy as heat. Illustrating by example, the heat emissive electrical component 502 can be the control circuit (301) of FIG. 3. As noted above, the heat emissive electrical component 502 can be any of a microprocessor, programmable logic, application specific integrated circuit device, or other similar device. Other heat emissive electrical components will be obvious to those of ordinary skill in the art having the benefit of this disclosure. In one embodiment, the heat emissive electrical component 502 has a heat dissipation greater than one watt. In one embodiment, the heat emissive electrical component 502 has a major component dimension greater than ten millimeters. This dimension and heat dissipation would be common when the heat emissive electrical component 502 is a microprocessor, for example.

In one embodiment, a shield 503 is disposed on the substrate 501. In one embodiment, the shield 503 encloses the heat emissive electrical component 502. As used herein, "enclose" means to surround on sides. Accordingly, the shield 503 and the substrate 501 completely enclose the heat emissive electrical component 502 in this illustrative embodiment.

A display assembly 101 is disposed above the shield 503. In one embodiment, a compression gasket 402 is disposed between the shield 503 and the display assembly 101. In one embodiment, the compression gasket 402 defines an aperture 504 above the heat emissive electrical component 502. As noted above, in one embodiment the aperture 504 has dimensions that are a function of a shield area, a heat emissive electrical component area, or combinations thereof. For example, in one embodiment the aperture 504 has a major aperture dimension greater than 0.9 times the major component dimension. In one embodiment, the major aperture dimension is greater than the major component dimension. In one embodiment, the major aperture dimension less than 1.2 times the major component dimension.

In one embodiment, the major shield dimension is greater than the major aperture dimension. In one embodiment, the major shield dimension is more than one millimeter greater than the major aperture dimension. In one embodiment, the major shield dimension is less than 1.2 times the major component dimension.

In one embodiment, the aperture 504 has a substantially rectangular perimeter with radiused corners. In other embodiments, the aperture 504 can take other shapes, including circular, triangular, polygonal, free form, and so forth. The shape of the aperture 504 can be determined from the application or heat emissive electrical component 502 with which the shield 503 is used.

In one embodiment, the compression gasket 402 applies a loading force applied between the display assembly 101 and the shield 503. In one embodiment, the loading force is a function of a difference between the major shield dimension and the major aperture dimension. In one embodiment, the loading force is further a function of a compression coefficient of the compressible pad. As shown in FIG. 5, in one embodiment, the first housing member 103 and the second housing member 203 are disposed opposite the assembly to compress the compression gasket 402 between the shield 503 and the display assembly 101.

Figure 6:
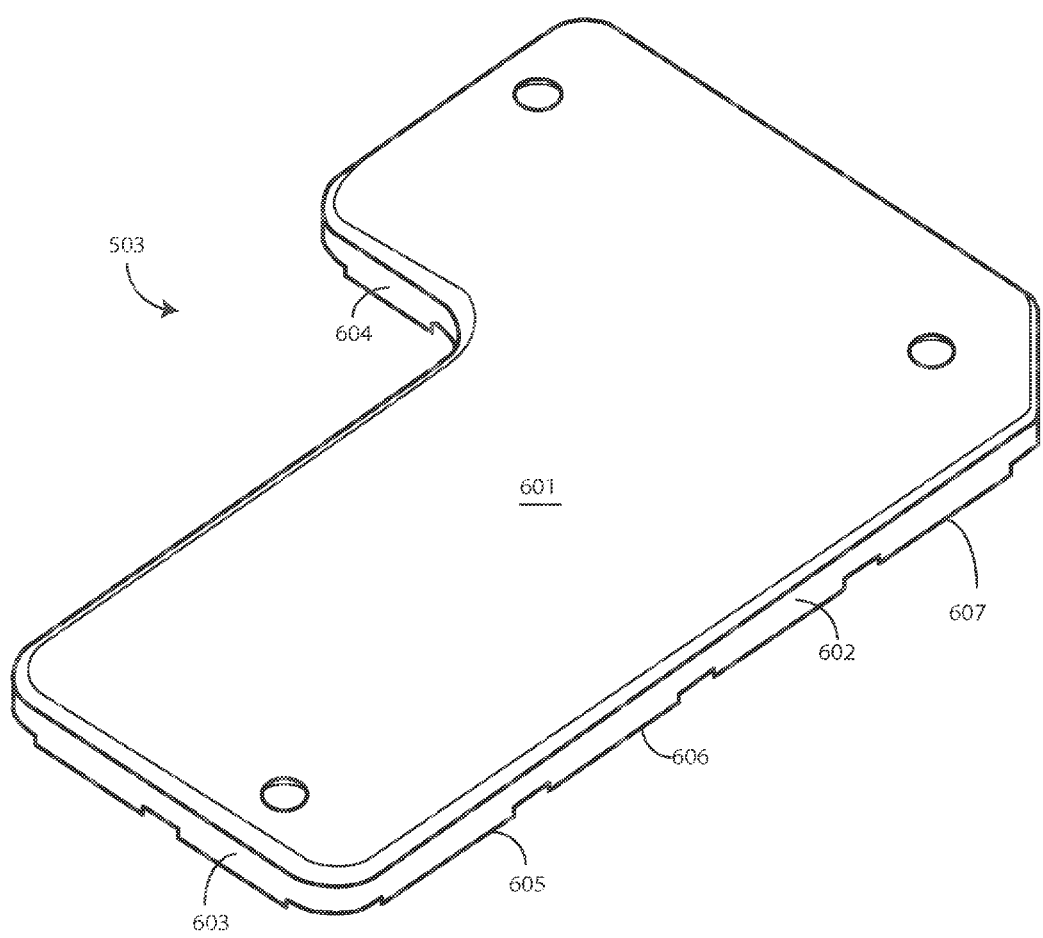
FIG. 6 illustrates one explanatory shield configured in accordance with one or more embodiments of the disclosure.

Turning now to FIG. 6, illustrated therein is one embodiment of a shield 503 configured in accordance with one or more embodiments of the disclosure. Electromagnetic shields are frequently found in radio frequency (RF) electronic devices or in other devices that may be sensitive to electromagnetic emissions. Shields are commonly used to isolate sensitive components residing on a circuit board. Shields can also serve a mechanical function, adding stability and reinforcing structure to circuit boards, displays, and housing members as well. For example, the shield 503 can be used to provide necessary stiffness, rigidity, and or support to a circuit board or other substrate. This is especially true when using compression gaskets as described below. In one or more embodiments, shields are made from a metal or metallized member that has a planar top surface and planar sidewalls extending orthogonally from each edge of the top surface. The bottom ends of the sidewalls may include feet or flanges so that the shield can be soldered to the circuit board.

As shown, the shield 503 has a substantially planar top surface 601 and substantially planar sidewalls 602,603,604 extending orthogonally from each edge of the substantially planar top surface 601. This particular shield 503 includes flanges 605,606,606.

In one embodiment, the shield 503 comprises a one-piece structure. In another embodiment, the shield 503 comprises a two-piece structure. The illustration in FIG. 5 illustrates a one-piece structure, where the planar top surface 601 and substantially planar sidewalls 602,603,604 are formed from a unitary piece of metal. In a two-piece structure, the substantially planar top surface 601 and the substantially planar sidewalls 602,603,604 are separate. The substantially planar sidewalls 602,603,604 can be soldered or otherwise coupled to a substrate. Once this is complete, the substantially planar top surface 601 can be attached to the substantially planar sidewalls 602,603,604. In one embodiment, the substantially planar top surface 601 is configured to snap onto the substantially planar sidewalls 602,603,604. Other embodiments of shields described below can likewise be configured as either one-piece or two-piece shields.

In one or more embodiments, shield 503 can be used to shield integrated circuits or other electronic components from electromagnetic emissions. The shield 503 can be soldered or otherwise coupled to a circuit substrate so as to cover the shielded electronic components. The shield 503 is suitable for use in many different types of electronic devices. Illustrating by example, the shield 503 can be used in mobile communication devices, such as smartphones, tablet computers, and so forth. Those of ordinary skill in the art having the benefit of this disclosure will understand that mobile communication devices are merely one type of electronic device for which the shield 503 is suited, and are being used purely for illustrative purposes. Shields configured in accordance with one or more embodiments of the disclosure are certainly usable and compatible with any number of different structures and devices.

In one embodiment, the shield 503 is manufactured from a sheet metal frame. For example, in one embodiment, the shield 503 can be machine formed from cold rolled steel. In other embodiments, the shield 503 can be manufactured from cast metal. Other materials and methods of manufacture for the shield will be obvious to those of ordinary skill in the art having the benefit of this disclosure.

Figure 7:
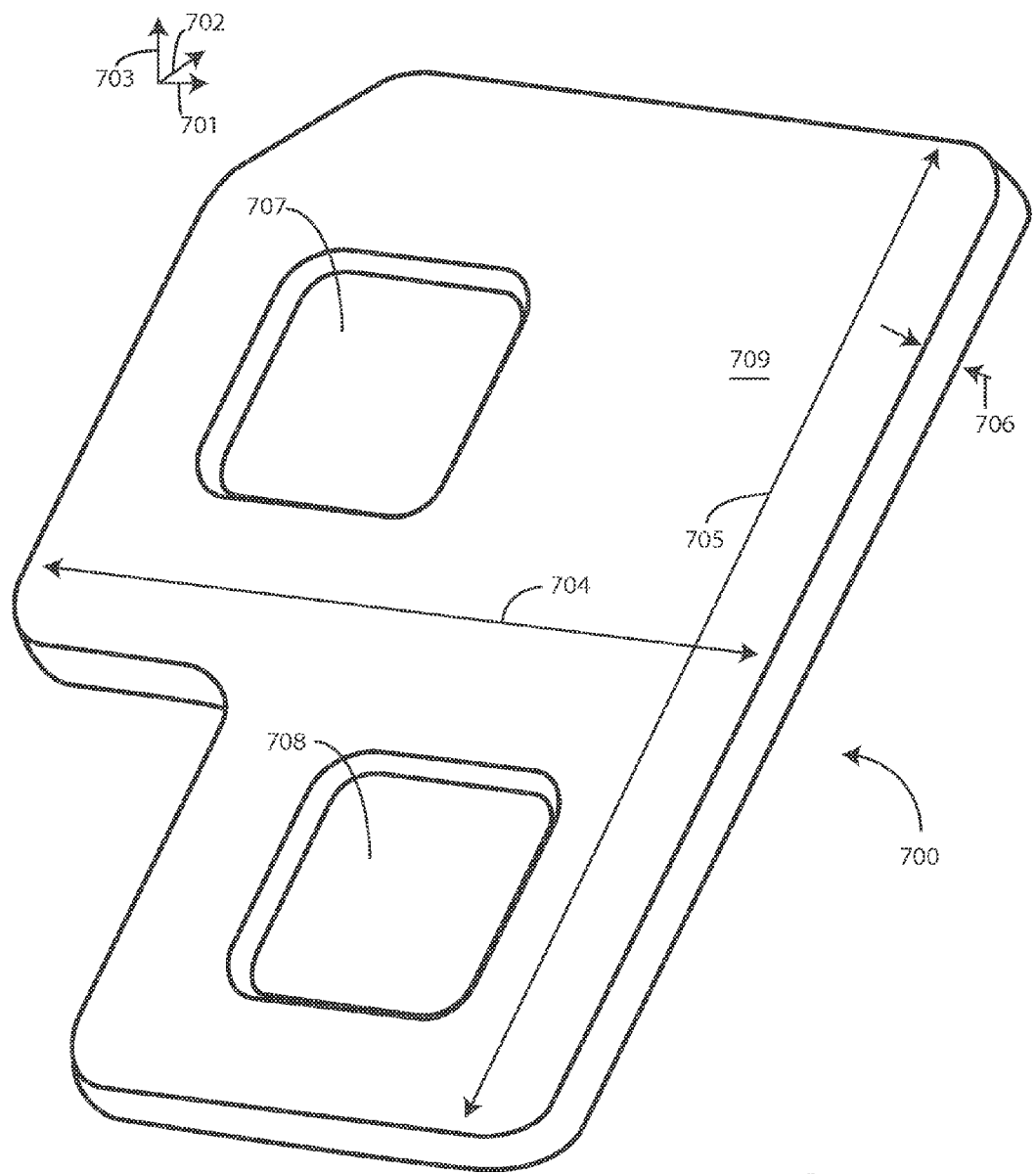
FIG. 7 illustrates a perspective view of an explanatory compression device configured in accordance with one or more embodiments of the disclosure.

Turning now to FIGS. 7-8 and 13, illustrated therein is one embodiment of a compressible pad 700 configured in accordance with one or more embodiments of the disclosure. The compressible pad 700, which can also be configured as a compression gasket in some embodiments, is manufactured from a compressible medium such as rubber or polymer. In this illustrative embodiment, compressible pad 700 has a width 704 along the x-axis 701 in a first dimension, and a length 705 along the y-axis 702 in a second dimension, which is orthogonal to the x-axis 701. The compressible pad 700 also has a compressible thickness 706 along the z-axis 703.

In one embodiment, the compressible pad 700 defines one or more apertures 707,708 along a major face 709. In one or more embodiments, the number of apertures 707,708 corresponds to a number of heat generating components disposed beneath a shield. For example, in one embodiment a "heat generating component" can be a cluster of components that are closely located on a circuit board. In such an embodiment, a particular aperture 707 may correspond to multiple heat emissive electrical components. In another embodiment, a heat generating component can be a single component, such as a microprocessor. In the latter embodiment, a particular aperture 707 will correspond to a heat emissive electrical component on a one-to-one basis. This illustrative embodiment includes two apertures 707,708. However it will be obvious to those of ordinary skill in the art having the benefit of this disclosure that other numbers of apertures, such as one, three, four, or eight, can be used without departing from the scope of the disclosure.

As noted above, in one embodiment, the apertures 707,708 have specifically designed dimensions. For example, in one embodiment, the apertures 707,708 have dimensions that are a function of a shield area, heat emissive electrical component area, or combinations thereof. In this illustrative embodiment, the apertures 707,708 are square shaped. Accordingly, the major dimensions, i.e. the length 801 and width 802 are equivalent. However, in other embodiments, the apertures 707,708 have different shapes. They can be polygonal, round, ovular, or take free form shapes. In such embodiments, the major dimension will be the longest length, width, or diameter.

In one or more embodiments, the apertures 707,708 have a major aperture dimension greater than 0.9 times the major component dimension above which a particular aperture sits. In one embodiment, the major aperture dimension is greater than the major component dimension. In one embodiment, the major aperture dimension less than 1.2 times the major component dimension. In one embodiment, the major shield dimension is greater than the major aperture dimension. In one embodiment, the major shield dimension is more than one millimeter greater than the major aperture dimension. In one embodiment, the major shield dimension is less than 1.2 times the major component dimension.

Figure 9:
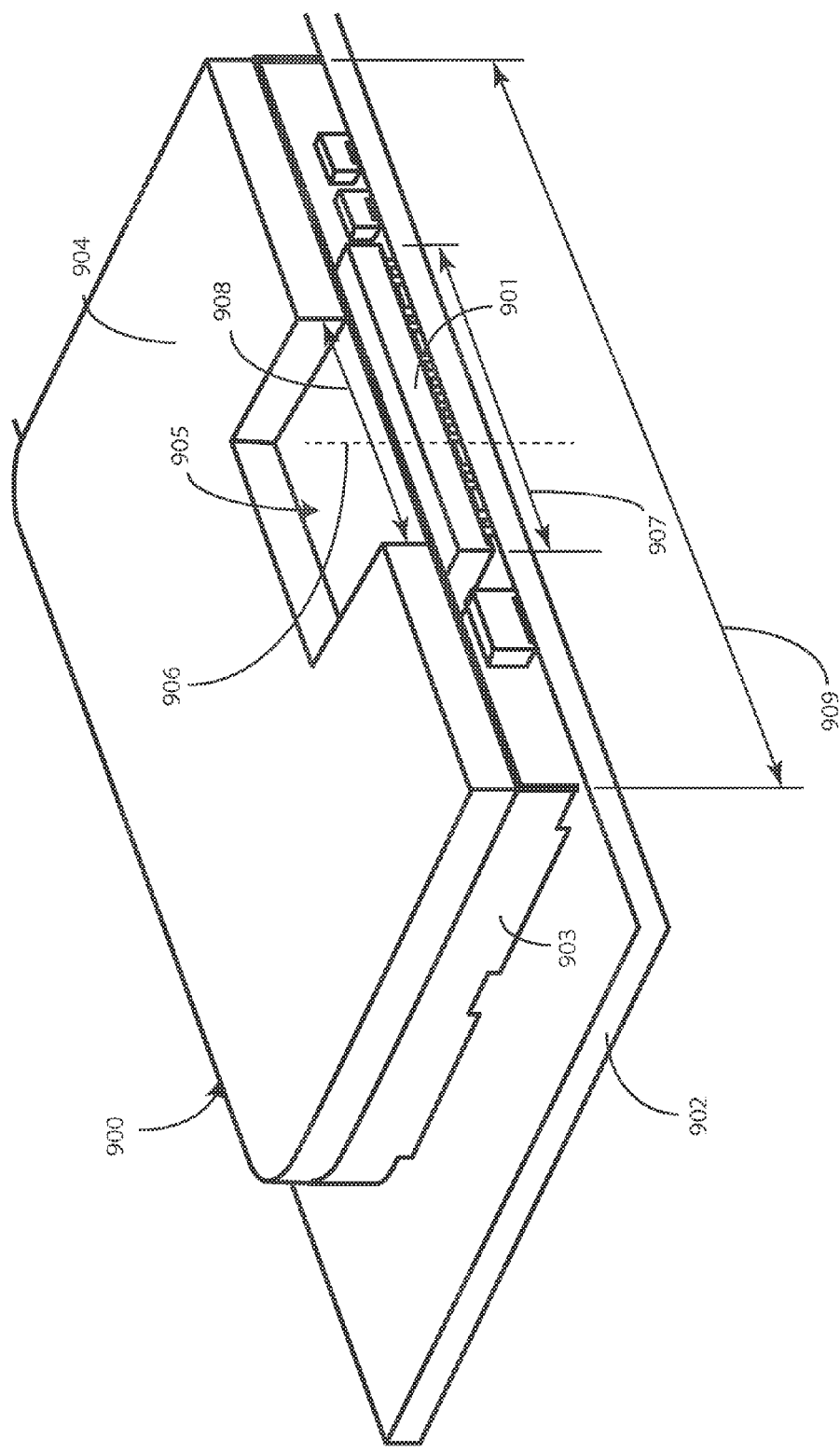
FIG. 9 illustrates an explanatory assembly configured in accordance with one or more embodiments of the disclosure.

Turning now to FIG. 9, illustrated therein is an example of an assembly 900 configured in accordance with one or more embodiments of the disclosure. As shown a heat dissipation device 901, which here is a microprocessor, is enclosed by a shield 903 and a circuit board 902. A compression gasket 904 is disposed above the shield 903. The compression gasket defines a chamber 905 created by an aperture in the compression gasket 904. As shown, the chamber 905 is axially aligned with the heat dissipation device 901 along axis 906. A device element, such as the display assembly (101) of FIG. 3, would sit atop the compression gasket 904. However, in the view of FIG. 9, the device element is not shown to make the other components viewable.

The heat dissipation device 901 has a major dimension 907. In one embodiment, this major dimension 907 is greater than ten millimeters. The chamber 905 has a major dimension 908. The shield 903 has a major dimension 909 as well.

In one embodiment, the major dimension 908 of the chamber 905 is greater than 0.9 times the major dimension 907 of the heat dissipation device 901. In one embodiment, the major dimension 908 of the chamber 905 is greater than the major dimension 907 of the heat dissipation device 901. In one embodiment, the major dimension 908 of the chamber 905 is less than 1.2 times the major dimension 907 of the heat dissipation device 901.

As shown in FIG. 9, in this illustrative embodiment, the major dimension 909 of the shield 903 is greater than the major dimension 908 of the chamber 905. To provide suitable support for the device element disposed above the compression gasket 904, in one embodiment, the major dimension 909 of the shield 903 is more than one millimeter greater than the major dimension 908 of the chamber 905. In one embodiment, the major dimension 909 of the shield 903 is less than 1.2 times the major dimension 909 of the heat dissipation device 901.

Figure 10:
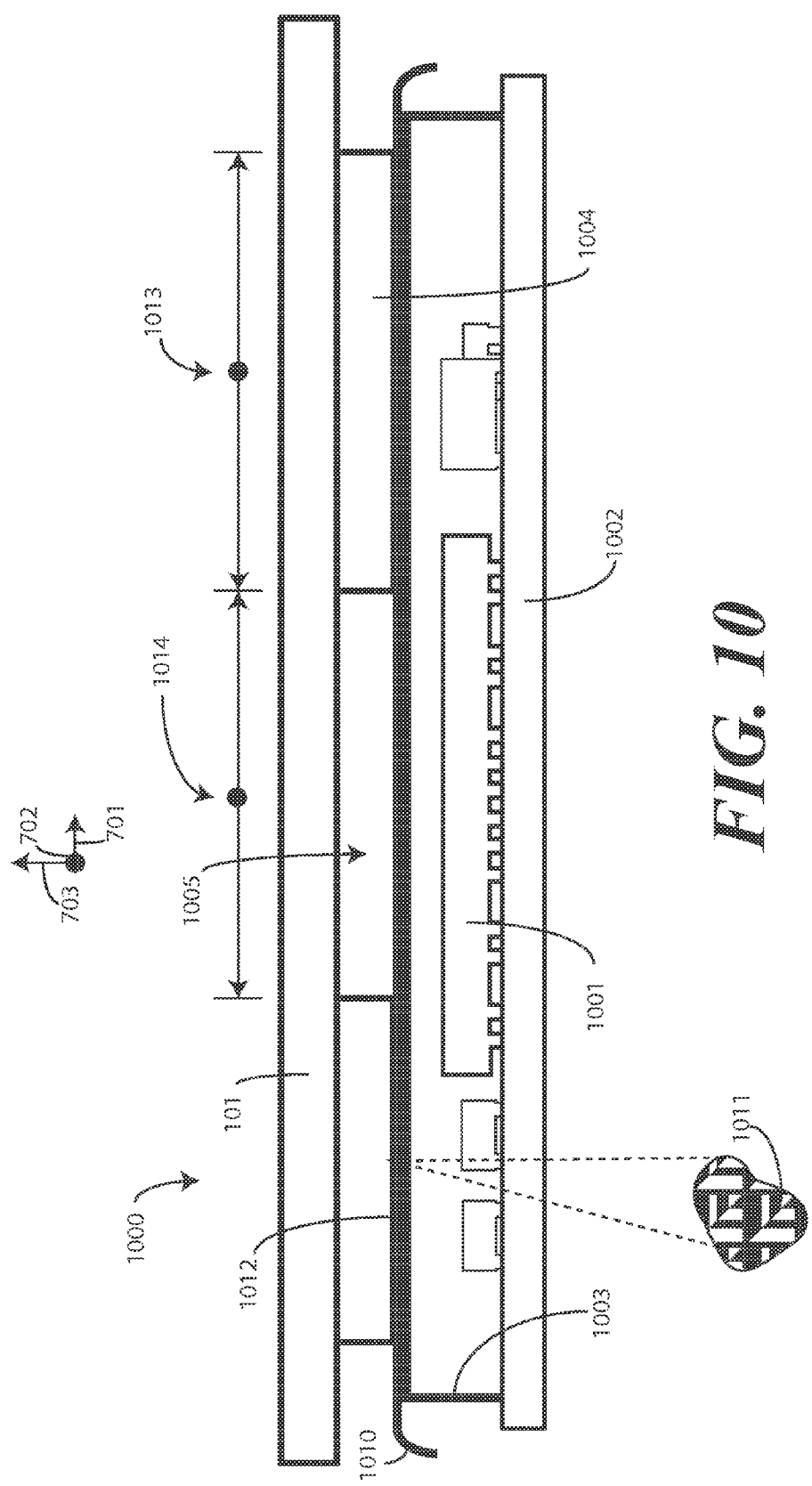
FIG. 10 illustrates another explanatory assembly configured in accordance with one or more embodiments of the disclosure.

Turning to FIG. 10, illustrated therein is another assembly 1000 configured in accordance with one or more embodiments of the disclosure. A heat emissive electrical component 1001 is disposed on a substrate 1002. A shield 1003 is disposed on the substrate 1002. The shield 1003 of this illustrative embodiment encloses the heat emissive electrical component 1001.

A display assembly 101 is disposed above the shield 1003. A compressible pad 1004 is disposed between the shield 1003 and the display assembly 101. As with other embodiments, the compressible pad 1004 defines an aperture 1005 above the heat emissive electrical component 1001. In one embodiment, the aperture 1005 has dimensions that are a function of a shield area, a heat emissive electrical component area, or combinations thereof.

When the assembly 1000 is assembled, the compressible pad 1004 applies loading force between the display assembly 101 and the shield 1003. For example, as noted above with reference to FIG. 3, a first and second housing assemblies may "clamp" the compressible pad 1004 between the display assembly 101 and the shield 1003. The compression modulus of the compressible pad 1004 results in a loading force—oriented outwardly—between the display assembly 101 and the shield 1003. This loading force adds additional stability to the overall mechanical structure of the assembly 1000. In one embodiment, the loading force is a function of a compression coefficient of the compressible pad 1004.

An optional heat spreader 1010 is shown disposed between the compressible pad 1004 and the display assembly 101. The heat spreader 1010 helps to transfer heat along the x-axis 701 and the y-axis 702 to prevent hot spots from forming on the shield. In other embodiments, the optional heat spreader 1010 can be disposed between the compressible pad 1004 and the shield 1003. In one or more embodiments, the compressible pad 1004 can have a reflective material 1011 disposed on its lower major face 1012. The reflective material 1011, which is also optional, helps to prevent heat from reaching the display assembly 101.

In this illustrative embodiment, the dimensions of the aperture 1005 are determined according to the following parameters:

Variables:

$L$chip=the longer of the length (along the y-axis 702) or the width (along the x-axis 701) of the heat emissive electrical component 1001     (EQ.1)

$L$cutout=the longer of the length (along the y-axis 702) or the width (along the x-axis 701) of the aperture 1005     (EQ. 2)

$L$shield=the longer of the length (along the y-axis 702) or the width (along the x-axis 701) of the shield 1003     (EQ. 3)

$T$shield=the thickness (along the z-axis 703) of the shield 1003     (EQ. 4)

$A$overlap=Area of overlap between compressible pad 1004 and the shield 1003.     (EQ. 5).

Illustrating by example, the compressible pad 1004 and shield 1003 overlap in area 1013, but do not overlap at areal 1014.

$F$pad=Loading force applied by compression of the compressible pad 1004     (EQ. 6)

$dx$=Amount of compression of the compressible pad 1004     (EQ. 7)

$E$=Young's modulus for the material of the compressible pad 1004     (EQ. 8)

(Note that E is a non-linear function of dx.)

From these variables, dimensions of the aperture 1005 can be calculated, in one embodiment, as follows:

Aperture major dimension>=0.9*$L$chip     (EQ. 9)

$L$shield>$L$cutout     (EQ. 10)

$L$shield−$L$cutout>1 mm     (EQ. 10)

$L$cutout<=1.2*$L$chip     (EQ. 11)

$L$shield<=1.2*$L$chip     (EQ. 12)

$F$pad=$K$pad*$dx$     (EQ. 13)

$K$pad=$E$*$A$overlap/$dx$     (EQ. 14)

Figure 11:
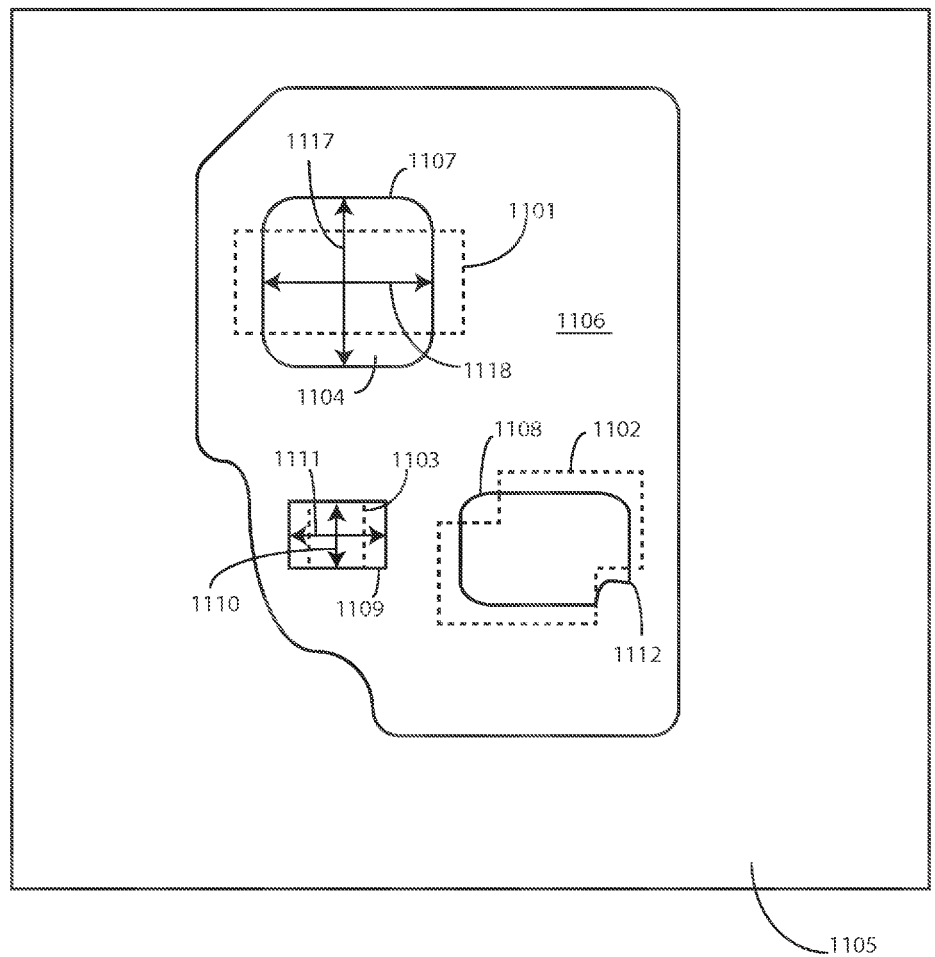
FIG. 11 illustrates heat dissipation devices enclosed by a shield in accordance with one or more embodiments of the disclosure.

In the embodiment of FIG. 10, the perimeter of the aperture 1005 corresponds generally to the perimeter of the heat emissive electrical component 1001. In this illustrative embodiment, both are substantially rectangular, but with different areas. Embodiments of the disclosure are not so limited. Turning now to FIG. 11, illustrated therein is but one example of the many different configurations possible without departing from the spirit and scope of the disclosure.

In FIG. 11, three heat dissipation devices 1101,1102,1103 are enclosed by a shield 1104 and a circuit board 1105. A compression gasket 1106 is disposed between the shield 1104 and a device element (not shown), such as a display assembly (101). The compression gasket 1106 defines three chambers 1107,1108,1109 that are axially aligned with the heat dissipation devices 1101,1102,1103.

Chamber 1107 is wider along a first dimension 1118 than the heat dissipation device 1101 to which it corresponds. Chamber 1107 is narrower along a second dimension 1119 than the heat dissipation device 1101. In this embodiment, the second dimension 1119 is substantially orthogonal to the first dimension 1118, than the heat dissipation device.

Chamber 1108 has a first perimeter shape, which in this embodiment is substantially rectangular. However, the heat dissipation device 1102 to which it corresponds has a second perimeter shape. The first perimeter shape and the second perimeter shape are different. Chamber 1108 also has a non-rectangular perimeter 1112.

Chamber 1109 has a common dimension 1110 with the heat dissipation device 1103 to which it corresponds. Chamber 1109 also has a different dimension 1111, orthogonal to the common dimension 1110, than the heat dissipation device 1103.

Figure 12:
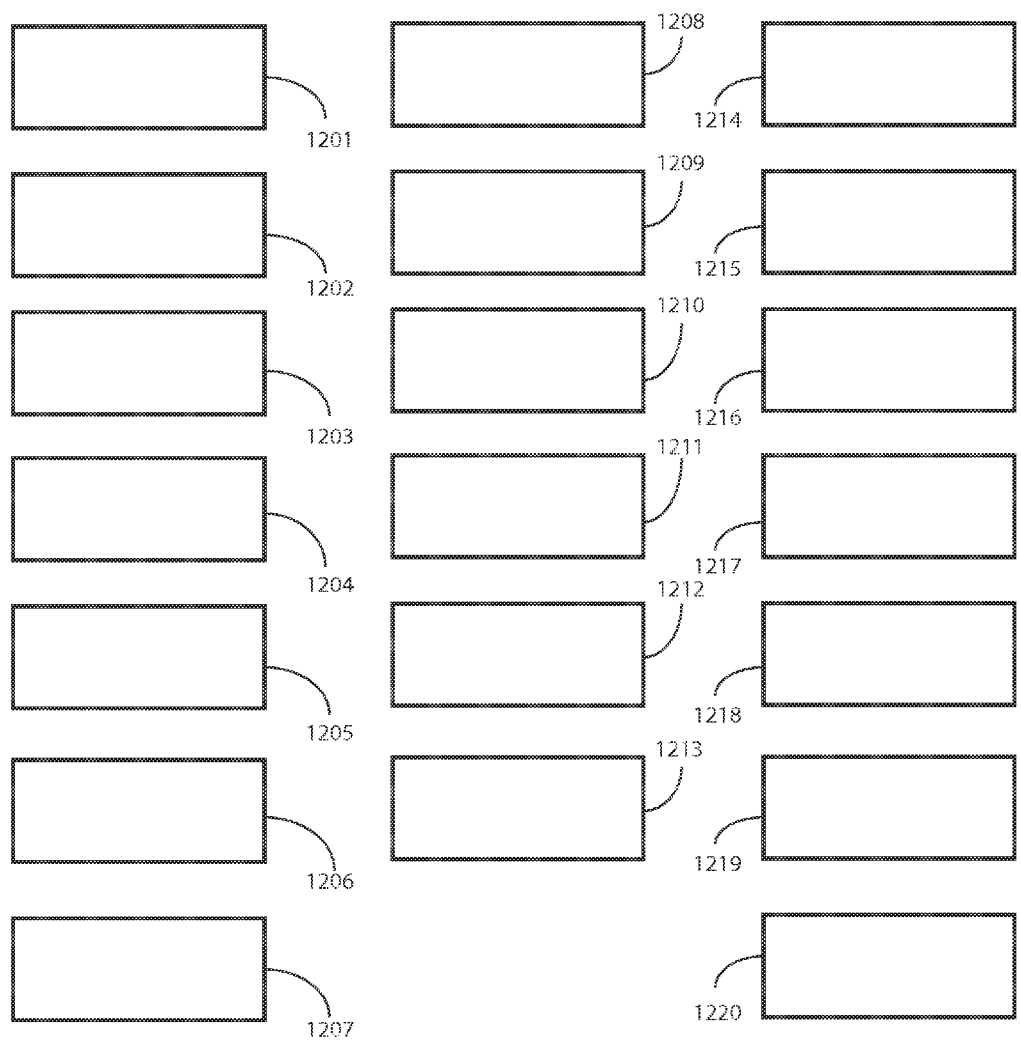
FIG. 12 illustrates various embodiments of the disclosure.

Turning now to FIG. 12, illustrated therein are various embodiments of the disclosure. At 1201, an assembly comprises a substrate, a heat emissive electrical component disposed on the substrate, and a shield disposed on the substrate enclosing the heat emissive electrical component. At 1201, the assembly also includes a display assembly and a compressible pad disposed between the shield and the display assembly. At 1201, the compressible pad defines an aperture above the heat emissive electrical component. At 1201, the aperture has dimensions that are a function of a shield area and a heat emissive electrical component area.

At 1202, the aperture of 1201 has a major aperture dimension greater than 0.9 times the major component dimension. At 1203, the major aperture dimension of 1202 is greater than the major component dimension. At 1204, the major aperture dimension of 1202 is less than 1.2 times the major component dimension. At 1205, the heat emissive electrical component of 1201 has a power dissipation greater than one watt. At 1206, the heat emissive electrical component of 1201 has a major component dimension greater than ten millimeters. At 1207, the major shield dimension of 1202 is greater than the major aperture dimension. At 1208, the major shield dimension of 1202 is more than one millimeter greater than the major aperture dimension. At 1209, the major shield dimension of 1202 is less than 1.2 times the major component dimension. At 1210, a loading force is applied by the compressible pad of 1201 between the display assembly and the shield. At 1210 the loading force is a function of a difference between the major shield dimension and the major aperture dimension. At 1211, the loading force of 1210 is further a function of a compression coefficient of the compressible pad. At 1212, the assembly of 1201 comprises a first housing member and a second housing member disposed opposite the assembly to compress the compressible pad between the shield and the display assembly.

At 1213, the compressible pad of 1201 comprises a reflective layer disposed adjacent to the shield. At 1214, the display assembly of 1201 comprises an organic light emitting display.

At 1215, an assembly comprises a heat dissipation device enclosed by a shield and a circuit board, a device element, and a compression gasket disposed between the shield and the device element. At 1215, the compression gasket defines a chamber axially aligned with the heat dissipation device.

At 1216, the device element of 1215 comprises a display. At 1217, the assembly of 1215 has a chamber being wider along a first dimension than the heat dissipation device and narrower along a second dimension, orthogonal to the first dimension, than the heat dissipation device. At 1218, the assembly of 1215 has a chamber having a first perimeter shape, the heat dissipation device having a second perimeter shape, the first perimeter shape and the second perimeter shape being different. At 1219, the assembly of 1215 has a chamber having a common dimension with the heat dissipation device and a different dimension, orthogonal to the common dimension, than the heat dissipation device. At 1220, the assembly of 1215 has a non-rectangular perimeter. Other embodiments aside from those shown in FIG. 12 will be obvious to those of ordinary skill in the art having the benefit of this disclosure.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An assembly, comprising: a substrate; a heat emissive electrical component disposed on the substrate; a shield disposed on the substrate enclosing the heat emissive electrical component; a display assembly; and a compressible pad disposed between the shield and the display assembly, the compressible pad defining an aperture above the heat emissive electrical component, the aperture having dimensions that are a function of a shield area and a heat emissive electrical component area.

2. The assembly of claim 1, the aperture having a major aperture dimension greater than 0.9 times a major component dimension.

3. The assembly of claim 2, the major aperture dimension greater than the major component dimension.

4. The assembly of claim 2, the major aperture dimension less than 1.2 times the major component dimension.

5. The assembly of claim 4, the heat emissive electrical component having a power dissipation greater than one watt.

6. The assembly of claim 4, the heat emissive electrical component having a major dimension greater than ten millimeters.

7. The assembly of claim 2, a major shield dimension greater than the major aperture dimension.

8. The assembly of claim 7, the major shield dimension more than one millimeter greater than the major aperture dimension.

9. The assembly of claim 7, the major shield dimension less than 1.2 times the major component dimension.

10. The assembly of claim 7, a loading force applied by the compressible pad between the display assembly and the shield a function of a difference between the major shield dimension and the major aperture dimension.

11. The assembly of claim 10, the loading force further a function of a compression coefficient of the compressible pad.

12. The assembly of claim 1, further comprising a first housing member and a second housing member disposed opposite the assembly to compress the compressible pad between the shield and the display assembly.

13. The assembly of claim 1, the compressible pad comprising a reflective layer disposed adjacent to the shield.

14. The assembly of claim 1, the display assembly comprising an organic light emitting display.

15. An assembly, comprising: a heat dissipation device enclosed by a shield and a circuit board; a device element comprising a display; and a compression gasket disposed between the shield and the device element, the compression gasket defining a chamber axially aligned with the heat dissipation device.

16. The assembly of claim 15, the chamber being wider along a first dimension than the heat dissipation device and narrower along a second dimension, orthogonal to the first dimension, than the heat dissipation device.

17. The assembly of claim 15, the chamber having a first perimeter shape, the heat dissipation device having a second perimeter shape, the first perimeter shape and the second perimeter shape being different.

18. The assembly of claim 15, the chamber having a common dimension with the heat dissipation device and a different dimension, orthogonal to the common dimension, than the heat dissipation device.

19. The assembly of claim 15, the chamber having a non-rectangular perimeter.

* * * * *